(12) United States Patent
Yoneima et al.

(10) Patent No.: US 7,423,220 B2
(45) Date of Patent: Sep. 9, 2008

(54) CONDUCTIVE PASTE FOR MULTILAYER ELECTRONIC COMPONENTS AND MULTILAYER ELECTRONIC COMPONENT USING SAME

(75) Inventors: Toshio Yoneima, Ogori (JP); Kaori Higashi, Chikugo (JP)

(73) Assignee: Shoei Chemical Inc., Tokyo (JP)

( * ) Notice: Subject to any disclaimer, the term of this patent is extended or adjusted under 35 U.S.C. 154(b) by 74 days.

(21) Appl. No.: 11/476,177

(22) Filed: Jun. 27, 2006

(65) Prior Publication Data

US 2007/0001152 A1     Jan. 4, 2007

(30) Foreign Application Priority Data

Jul. 1, 2005      (JP)     ............... 2005-194098
May 30, 2006  (JP)     ............... 2006-149388

(51) Int. Cl.
  *H05K 1/09*    (2006.01)
  *B32B 3/00*    (2006.01)

(52) U.S. Cl. .................. 174/257; 428/210; 361/751; 252/510; 252/511

(58) Field of Classification Search ......... 428/209–210; 361/751; 174/257; 252/500, 510–511
See application file for complete search history.

(56) References Cited

U.S. PATENT DOCUMENTS

| | | | | |
|---|---|---|---|---|
| 4,465,727 A | * | 8/1984 | Fujita et al. | 428/138 |
| 4,547,625 A | * | 10/1985 | Tosaki et al. | 174/256 |
| 4,624,934 A | * | 11/1986 | Kokubu et al. | 501/17 |
| 4,764,233 A | * | 8/1988 | Ogihara et al. | 156/89.18 |
| 4,765,929 A | | 8/1988 | Shaffer | |
| 4,985,376 A | * | 1/1991 | Sunahara et al. | 501/22 |
| 5,336,301 A | | 8/1994 | Tani et al. | |
| 6,841,493 B2 | * | 1/2005 | Cho et al. | 501/32 |
| 7,018,568 B2 | * | 3/2006 | Tierney | 252/511 |
| 7,189,341 B2 | * | 3/2007 | Li et al. | 252/511 |

FOREIGN PATENT DOCUMENTS

| | | |
|---|---|---|
| EP | 1 509 071 A1 | 2/2005 |
| JP | 7-21833 | 1/1995 |
| JP | 7-240340 | 9/1995 |
| JP | 9-17687 | 1/1997 |
| SU | 1 689 996 A1 | 11/1991 |

* cited by examiner

*Primary Examiner*—Cathy F. Lam
(74) *Attorney, Agent, or Firm*—Flynn, Thiel, Boutell & Tanis, P.C.

(57) ABSTRACT

A conductive paste for multilayer electronic components which is to be directly printed on a ceramic green sheet, the conductive paste contains a conductive powder, a resin and an organic solvent, wherein the organic solvent contains at least one solvent selected from an alkylene glycol diacetate and an alkylene glycol dipropionate. A multilayer electronic component is obtained by firing at high temperature an unfired laminate prepared by alternately stacking ceramic green sheets and internal electrode paste layers in which each of the internal electrode paste layers is formed by the above conductive paste. The conductive paste has appropriate viscosity characteristics and long-term stability, which allows manufacturing highly reliable multilayer electronic components having excellent electrical characteristics, without causing sheet attack.

6 Claims, No Drawings

CONDUCTIVE PASTE FOR MULTILAYER ELECTRONIC COMPONENTS AND MULTILAYER ELECTRONIC COMPONENT USING SAME

BACKGROUND OF THE INVENTION

1. Field of the Invention

The present invention relates to a conductive paste, in particular to a conductive paste suitable for forming electrodes in multilayer electronic components such as multilayer capacitors, multilayer inductors, multilayer actuators and the like, and to a multilayer electronic component manufactured using the conductive paste. In particular, the invention relates to a conductive paste printed directly on ceramic green sheets for forming internal electrodes in multilayer electronic components.

2. Description of the Related Art

Multilayer ceramic electronic components (hereinafter also referred to as "multilayer electronic components") are usually manufactured as follows. A ceramic green sheet (hereinafter also referred to as "green sheet") is prepared by dispersing a ceramic raw-material powder such as a dielectric material, a magnetic material, a piezoelectric material or the like in a vehicle containing a resin binder and a solvent. Onto this green sheet a conductive paste for internal electrodes obtained by dispersing, in a vehicle containing a resin binder and a solvent, an inorganic powder comprising as a main component, a conductive powder such as a noble metal, copper, nickel, or the like and optionally a ceramic powder or the like is printed in a predetermined pattern; and the solvent is removed through drying to form thereby an internal electrode dry film. The obtained green sheets having an internal electrode dry film are stacked and pressure-bonded to yield an unfired laminate in which the green sheets are alternately laminated with internal electrode paste layers. After being cut to a predetermined shape, this laminate is fired at a high temperature to simultaneously sinter the ceramic layers and form the internal electrode layers, and yield thereby a ceramic body. A conductive paste for terminal electrodes is subsequently applied to both end faces of the ceramic body using a printing method, a dipping method or the like, and then the paste is fired to yield a multilayer electronic component. The terminal electrode paste and the unfired laminate may also be co-fired.

The growing demand in recent years for miniaturized, highly multilayered electronic components has given strength, in particular, to a trend towards achieving ever thinner ceramic layers and internal electrode layers in multilayer ceramic capacitors using nickel as a conductive powder, which has boosted the use of thin ceramic green sheets.

Butyral resins and/or acrylic resins are generally used as the binder component of ceramic green sheets. On the other hand, cellulose resins, such as ethyl cellulose, are chiefly used as the binder component of conductive pastes. A constitution with such materials is problematic in that, after printing, the highly polar solvents such as terpineol, butyl carbitol, octanol or the like used ordinarily in the conductive paste dissolve the binder of the ceramic green sheet, in a phenomenon called "sheet attack", which gives rise, among other effects, to deformation and/or insulation loss in the ceramic layers, and is thus highly detrimental to the characteristics of the multilayer electronic product. This problem has become more serious in the wake of the recent trend towards thinner layers in ceramic green sheets, with sheets thinner than 5 μm.

In order to prevent such sheet attack, mixed solvents combining the above highly polar organic solvents with petroleum-derived hydrocarbon solvents, to which the resins in the green sheet have poor solubility, have been conventionally used, as the solvent component of the conductive paste, in an attempt to reduce thereby the proportion of polar solvents (see for instance Patent Document 1). However, increasing the proportion of the above hydrocarbon solvents with a view of curbing sheet attack reduces the solubility of the cellulose resin, which is the binder of the conductive paste, and decreases paste viscosity. In order to maintain an appropriate paste viscosity, it becomes then necessary to use an excess of resin, which increases the thickness of the coated paste layers, thereby causing laminate deformation and so on, which are especially detrimental in highly multilayered laminates, and which impairs the long-term stability of the paste characteristics, thereby giving rise to various difficulties in paste design.

Another known approach for suppressing sheet attack involves using a terpineol derivative such as dihydroterpineol, terpineol acetate or dihydroterpineol acetate as the solvent component of the conductive paste (see for instance Patent Documents 2, 3). However, the effectiveness of, for instance, dihydroterpineol and terpineol acetate is insufficient, while sheet attack cannot be prevented when the green sheet is extremely thin, in particular for thin green sheets having a thickness of less than 5 μm and using a butyral resin as the binder. The use of these solvents results in substantial paste viscosity changes over time, which preclude obtaining a uniform film thickness of the paste layer during printing; thus, multilayer components having excellent electrical characteristics cannot be obtained, since multilayer electronic components manufactured using such pastes with thin green sheets suffer delamination and/or cracking. In particular this is true of highly multilayered components with thinner green sheets.

Other known methods involve forming internal electrodes using a transfer method or the like, without direct printing of a conductive paste on a ceramic green sheet. In such methods, the conductive paste is printed on a carrier film or the like, is dried, and after solvent removal, is transferred onto a ceramic green sheet; although sheet attack is prevented, such methods are technically complex.

[Patent Document 1] Japanese Patent Publication No. 7-240340A

[Patent Document 2] Japanese Patent Publication No. 9-17687A

[Patent Document 3] Japanese Patent Publication No. 7-21833A

SUMMARY OF THE INVENTION

An object of the present invention is to provide a conductive paste having an excellent stability, undergoing none of the above sheet attack problems when directly printed on a ceramic green sheet, and having appropriate viscosity characteristics suitable for printing. In particular, an object of the invention is to obtain, highly reliable multilayer ceramic electronic components (including highly multilayered components) having excellent electrical characteristics and in which sheet attack does not occur, even for thin green sheets having a thickness of 5 μm or less, in particular, green sheets using a butyral-type resin as a binder.

As a result of diligent research, the inventors perfected the present invention upon finding that the above problems of the invention can be solved by using as the solvent of the conductive paste for multilayer electronic components at least one solvent selected from an alkylene glycol diacetate and an alkylene glycol dipropionate.

Specifically, the present invention has the constitutions below.

(1) A conductive paste for multilayer electronic components which is to be directly printed on a ceramic green sheet, the conductive paste comprising a conductive powder, a resin, and an organic solvent, wherein the organic solvent comprises at least one solvent selected from an alkylene glycol diacetate and an alkylene glycol dipropionate.

(2) The conductive paste for multilayer electronic components according to (1), wherein the alkylene glycol diacetate is a diacetate of an alkylene glycol having 2 to 6 carbon atoms, and the alkylene glycol dipropionate is a dipropionate of an alkylene glycol having 2 to 6 carbon atoms.

(3) The conductive paste for multilayer electronic components according to (1) or (2), wherein the ceramic green sheet is a ceramic green sheet having a thickness of 5 μm or less.

(4) The conductive paste for multilayer electronic components according to any one of (1) to (3), wherein the ceramic green sheet comprises a resin binder containing a butyral resin as a main component.

(5) The conductive paste for multilayer electronic components according to any one of (1) to (4), wherein a main component of the resin contained in the conductive paste is a cellulose resin.

(6) A multilayer electronic component obtained by firing at high temperature an unfired laminate prepared by alternately stacking ceramic green sheets and internal electrode paste layers, wherein each of the internal electrode paste layers is formed using the conductive paste for multilayer electronic components according to any one of (1) to (5).

(7) The multilayer electronic component according to (6), wherein the thickness of the ceramic green sheets is 5 μm or less.

(8) The multilayer electronic component according to (6) or (7), wherein each of the ceramic green sheets comprises a resin binder containing a butyral resin as a main component.

By using as the organic solvent at least one solvent selected from an alkylene glycol diacetate and an alkylene glycol dipropionate, the conductive paste of the present invention prevents the occurrence of sheet attack, even in the case of direct printing on a ceramic green sheet. In particular, a multilayer electronic component is obtained herein having excellent electrical characteristics and reliability, exerting no negative effects on the ceramic green sheet, and causing no ceramic layer deformation or insulation defects, even for a sheet thickness of 5 μm or less. Sheet attack prevention is particularly effective when a butyral resin is used as the resin binder in the ceramic green sheet.

In particular, the alkylene glycol diacetate and/or the alkylene glycol dipropionate exhibits high solubility to the resin binder of the conductive paste when the main component of the resin binder contained in the conductive paste is a cellulose resin, in particular ethyl cellulose. This allows achieving appropriate viscosity characteristics without using an excess of resin, and affords superior long-term stability.

Using such conductive paste for forming internal electrodes, moreover, allows the obtaining of a superior multilayer electronic component free from ceramic green sheet damage, and, in particular, allows the obtaining of highly reliable multilayer electronic components as highly multilayered components having extremely thin ceramic layers and thin internal electrode layers.

DETAILED DESCRIPTION OF THE PREFERRED EMBODIMENTS (Conductive Powder)

The conductive powder used in the present invention is not particularly limited and may be, for instance, a metal powder of nickel, copper, cobalt, gold, silver, palladium, platinum or the like, or an alloy powder thereof. Herein can also be used a conductive metal oxide, or a composite powder of an inorganic powder of glass, ceramic, or the like, coated with metal. The metal powder or the alloy powder can be used having a thin oxide layer on its surface, or can be used with a glassy substance and/or various oxides deposited on its surface, with a view of curbing oversintering. These conductive powders may be used in mixtures of two or more. The conductive powder may also undergo, if needed, a surface treatment using organometallic compounds, surfactants, fatty acids or the like.

The particle size of the conductive powder is not particularly limited; herein are preferably used particles having an average particle size of up to about 3 μm, such as those ordinarily employed in conductive pastes for internal electrodes. Micro-powders having good dispersibility, with an average particle size of 0.05 to 1.0 μm are preferably used in order to form thin internal electrode layers of high fineness and smoothness. The present invention affords remarkable effects, in particular, when using an ultra-fine conductive powder such as a nickel powder or the like, having an average particle size of 0.5 μm or less, for forming internal electrodes of highly multilayered capacitors.

(Resin)

Though not particularly restricted, the resin is preferably a cellulose resin such as ethyl cellulose, hydroxyethyl cellulose, ethyl hydroxyethyl cellulose, methylcellulose, nitrocellulose and the like. Especially preferred herein is ethyl cellulose. If needed, the cellulose resin may be used concomitantly with other resins. A mixture of resins having a good adherence towards ceramic green sheets, such as an acrylic resin, a methacrylic resin, a butyral resin, an epoxy resin, a phenol resin, rosin or the like, as disclosed for instance in Japanese Patent Publication No. 2004-186339A, may also be used. The proportion of resin is not particularly restricted, but ranges ordinarily from about 1 to about 15 parts by weight relative to 100 parts by weight of the conductive powder.

(Organic Solvent)

The alkylene glycol diacetate blended in as the organic solvent in the conductive paste of the present invention is preferably at least one diacetate of an alkylene glycol with 2 to 6 carbon atoms selected from the group consisting of ethylene glycol diacetate, propylene glycol diacetate, butylene glycol diacetate, pentylene glycol diacetate, and hexylene glycol diacetate. Alternatively, the alkylene glycol dipropionate blended in as the organic solvent is preferably at least one diacetate of an alkylene glycol with 2 to 6 carbon atoms selected from the group consisting of ethylene glycol dipropionate, propylene glycol dipropionate, butylene glycol dipropionate, pentylene glycol dipropionate, and hexylene glycol dipropionate.

These alkylene glycol diacetates or alkylene glycol dipropionates make it less likely for sheet attack to occur in a ceramic green sheet using a butyral resin or an acrylic resin as a binder and afford, in particular, a remarkably superior sheet attack prevention effect in ceramic green sheets using a butyral resin. Thus, sheet attack can be prevented, without dissolution or swelling of the green sheets, even when the conductive paste is printed on particularly thin ceramic green sheets, having a thickness of 5 μm or less and containing a butyral resin as the main resin binder. Moreover, a desired viscosity can be ensured using the right amount of resin, thanks to the high solubility of the cellulose resin, such as ethyl cellulose or the like, used as the resin component of the conductive paste. The stability of the paste is also excellent, with the viscosity changing very little over time.

In the present invention, it is not mandatory to use concomitantly a solvent other than the above-described alkylene glycol diacetate/alkylene glycol dipropionate. Provided that the effect of the invention does not become impaired thereby, however, other organic solvents may be formulated additionally, to allow the obtaining of desired paste characteristics. When other resins are used together with a cellulose resin as the resin binder of the conductive paste, for instance, the solubility of the resins may be further enhanced by using a solvent mixture with other organic solvents, which affords more freedom in paste design. In particular, in case of a conductive paste using, in addition to the cellulose resin, a resin insoluble in alkylene glycol diacetates/alkylene glycol dipropionates, such as an acrylic resin, a methacrylic resin, a butyral resin or the like, blending of a suitable solvent in which these resins are soluble allows the preserving of adequate paste viscosity without increasing the amount of resin.

Other solvents include, though not particularly limited thereto, hydrocarbon solvents such as paraffinic hydrocarbons, olefinic hydrocarbons, naphthenic hydrocarbons, aromatic hydrocarbons, as well as mixed solvents of the foregoing, and polar solvents such as alcohols, ethers, esters, ketones or glycols, for instance, octanol, decanol, terpineol, terpineol acetate, dihydroterpineol, dihydroterpineol acetate, butyl carbitol, butyl cellosolve, butyl carbitol acetate and the like.

The amount of other solvents is not particularly restricted. For instance, a mixed solvent may be used in which dihydroterpineol, dihydroterpineol acetate or the like, which are solvents relatively unlikely to cause sheet attack, are partially replaced by an alkylene glycol diacetate and/or an alkylene glycol dipropionate. If a hydrocarbon solvent is used, the proportion thereof relative to the total solvent is preferably at most 30 wt %. In case of polar solvents such as terpineol, octanol or the like, for which the resin binder in the ceramic green sheet has a high solubility, the proportion of the aforementioned polar solvents relative to the total solvent is preferably at most 40 wt %.

The total amount of organic solvent in the conductive paste is not particularly restricted, provided it is an amount ordinarily used, and may be formulated arbitrarily in accordance with the characteristics of the conductive powder, the type of resin, the coating method, the coated film thickness, and so on, and ranges ordinarily from about 40 to about 150 parts by weight relative to 100 parts by weight of conductive powder.

(Other Additive Components)

Apart from the above components, various additives may also be added to the conductive paste of the present invention. For instance, surfactants and/or chelating agents may be added, singly or in combinations of two or more, with a view of increasing the dispersibility of inorganic powders such as the conductive powder, ensuring the long-term stability of the viscosity of the conductive paste, and securing the appropriate flow characteristics during printing.

Surfactants that may be used include, for instance, allyl polyethers and copolymers thereof, such as polyethylene glycol allyl ether, methoxypolyethylene glycol allyl ether and the like; polyalkylene glycol amines such as polyethylene glycol lauryl amine, polyethylene glycol stearyl amine and the like; phosphoric acid esters such as polyethylene glycol alkyl phosphates and the like; polyalkylene glycol phenols such as polyethylene glycol nonyl phenyl ether and the like; sorbitan esters such as sorbitan monolaurate, sorbitan monooleate, sorbitan trioleate and the like; sorbitan ester ethers such as polyethylene glycol sorbitan monolaurate, polyethylene glycol sorbitan monooleate and the like; fatty acids such as oleic acid, lauric acid and the like; amides such as oleic acid amide, stearic acid amide, polyethylene glycol alkylamides and the like. Preferred surfactants among the foregoing are in particular allyl polyether copolymers and polyethylene glycol alkylamines, owing to their substantial dispersibility-enhancing effect. Chelating agents include, besides the above polyalkylene glycol amines and amides, amine solvents such as triethanolamine, diethanolamine, alkylamines, 3-butoxypropylamine, 2-aminopropanol and the like. Particularly preferred herein are triethanolamine and 3-butoxypropylamine.

To the conductive paste of the invention may also be arbitrarily added, as the case may require, other components that are ordinarily added, i.e. inorganic powders, such as ceramics containing components whose compositions are the same as or close to those of the ceramics contained in ceramic green sheets, glass, metal oxides (e.g., alumina, silica, copper oxide, manganese oxide, titanium oxide or the like), montmorillonite or the like; organometallic compounds; plasticizers; dispersants, or the like.

(Manufacture of the Conductive Paste)

The conductive paste of the present invention is manufactured by homogeneously dispersing the conductive powder and the other additive components in a vehicle containing the resin and the solvent, using conventional methods.

As a conductive paste used for direct printing on ceramic green sheets such as those of multilayer capacitors, multilayer inductors, multilayer actuators and the like, the conductive paste of the present invention is suitable for forming internal electrodes or terminal electrodes in multilayer ceramic electronic components.

(Manufacture of the Multilayer Electronic Component)

The multilayer electronic component is manufactured using the conductive paste of the invention for forming inner conductors. As an example thereof, a method for manufacturing a multilayer ceramic capacitor is described below.

A ceramic green sheet is manufactured first by dispersing a dielectric ceramic raw-material powder in a resin binder and by forming a sheet using a doctoring blade method or the like. As dielectric ceramic raw-material powders are ordinarily used powders having as a main component a perovskite oxide such as barium titanate, strontium zirconate, calcium strontium zirconate, lead titanate or the like, or an oxide wherein the metal elements constituting the foregoing are partially replaced by another metal element. Various additives may also be added to these raw-material powders, as the case may require, in order to adjust the characteristic of the capacitor. Resins having as a main component thereof a butyral resin, an acrylic resin or the like are used as the resin binder. When, in particular, the sheet thickness of the green sheet is 5 µm or less, a resin binder having a butyral resin as a main component thereof is preferably used, as it allows increasing sheet density, with better dispersibility, while affording a high flexibility.

The conductive paste of the invention is applied on the obtained ceramic green sheets using a conventional method such as screen printing or the like and is dried to remove the solvent, and to form an internal electrode paste dry film of a predetermined pattern. A predetermined number of the ceramic green sheets on which the internal electrode paste dry film is formed are then stacked and pressure-laminated to manufacture thereby an unfired laminate. The laminate is cut to a predetermined shape and then the binder is removed from the laminate at about 250 to about 350° C. in an inert gas atmosphere or an inert gas atmosphere containing some oxygen, to decompose and drive off the vehicle component; the laminate is then fired in a non-oxidative atmosphere at about 1100 to about 1350° C. to sinter simultaneously the dielectric layers and the electrode layers, and is optionally subjected to a re-oxidation treatment, to yield a multilayer ceramic capacitor body. Terminal electrodes are then adhered on both end faces of the capacitor body by firing. The terminal electrodes may also be formed by applying the conductive paste of the present invention to both end faces of a chip cut out from the above-mentioned unfired laminate, followed by simultaneous firing with the laminate chip.

The present invention is explained in detail next by means of examples, though it is in no way meant to be limited to or by them.

EXAMPLE 1

A conductive paste was manufactured by mixing 100 parts by weight of a nickel powder having a specific surface area of 3.5 $m^2/g$ and an average particle size of 0.2 μm calculated from SEM observations, as the conductive powder; 5 parts by weight of ethyl cellulose as the resin binder; and 100 parts by weight of ethylene glycol diacetate as the solvent, and by kneading then the mixture using a 3-roller mill.

This paste was printed on two types of 4 μm-thick barium titanate-type ceramic green sheets using respectively a butyral resin and an acrylic resin as the resin binder, in such a way so as to yield a dry film thickness of 2 μm with a predetermined internal electrode shape; the paste was then dried for 5 minutes at 90° C. to form a conductive paste dry film. The rear side of the portions of the ceramic green sheet covered by the conductive paste dry film were visually inspected to evaluate the extent of sheet attack, on the basis of the observed degree of deformation due to warping, breaking or the like, and the color change. The results are given in Table 1. The evaluation criteria are as follows:

○: virtually no change, Δ: swelling, X: occurrence of warping/breaking.

EXAMPLES 2 to 5

Conductive pastes were prepared in the same way as in Example 1, but using herein, as the solvent, propylene glycol diacetate (1,2-propylene glycol diacetate), butylene glycol diacetate (1,3-butylene glycol diacetate), pentylene glycol diacetate (pentamethylene glycol diacetate), and hexylene glycol diacetate (hexamethylene glycol diacetate). Sheet attack was evaluated in the same way. The results are listed collectively in Table 1.

EXAMPLES 6 and 7

Conductive pastes were prepared in the same way as in Example 1, but using herein, as the solvent, propylene glycol dipropionate (1,2-propylene glycol dipropionate), butylene glycol dipropionate (1,3-butylene glycol dipropionate). Sheet attack was evaluated in the same way. The results are listed collectively in Table 1.

COMPARATIVE EXAMPLES 1 to 2

Conductive pastes were prepared in the same way as in Example 1, but using herein, as the solvent, terpineol and terpineol acetate. Sheet attack was evaluated in the same way. The results are listed collectively in Table 1.

TABLE 1

| | Solvent in the conductive paste | Resin in the ceramic green sheet | |
|---|---|---|---|
| | | Butyral resin | Acrylic resin |
| Example 1 | Ethylene glycol diacetate | ○ | ○ |
| Example 2 | Propylene glycol diacetate | ○ | ○ |
| Example 3 | Butylene glycol diacetate | ○ | ○ |
| Example 4 | Pentylene glycol diacetate | ○ | ○ |
| Example 5 | Hexylene glycol diacetate | ○ | ○ |
| Example 6 | Propylene glycol dipropionate | ○ | ○ |
| Example 7 | Butylene glycol dipropionate | ○ | ○ |
| Comparative Example 1 | Terpineol | x | x |
| Comparative Example 2 | Terpineol acetate | Δ | Δ |

The results of Table 1 show that using an alkylene glycol diacetate or alkylene glycol dipropionate as the solvent of the conductive paste prevented swelling and deformation in a 4 μm-thick ceramic green sheet. By contrast, sheet attack occurred when conventional terpineol or terpineol acetate were used as the solvent. Detailed examination of the green sheets by electronic microscopy revealed virtually no deformation, in particular, for the butyral resin-type green sheets on which were applied the pastes of Examples 1 to 3 and Example 6, as an indication of excellent preventive effect against sheet attack.

EXAMPLES 8 to 10

COMPARATIVE EXAMPLES 3 and 4

Following the same procedure of Example 1, barium titanate-type ceramic green sheets having a thickness of 3 μm and employing a butyral resin or an acrylic resin were evaluated using the pastes of Examples 1 to 3 and Comparative Examples 1 and 2. The evaluation results are given in Table 2.

TABLE 2

| | Solvent in the conductive paste | Resin in the ceramic green sheet | |
|---|---|---|---|
| | | Butyral resin | Acrylic resin |
| Example 8 | Ethylene glycol diacetate | ○ | Δ |
| Example 9 | Propylene glycol diacetate | ○ | Δ |
| Example 10 | Butylene glycol diacetate | ○ | Δ |
| Comparative Example 3 | Terpineol | x | x |
| Comparative Example 4 | Terpineol acetate | x | x |

The results of Table 2 show that the conductive paste of the present invention prevented swelling and deformation also in the extremely thin 3 μm-thick ceramic green sheets using a butyral resin, although the 3 μm-thick green sheets using an acrylic resin exhibited slight swelling. Both butyral resin-type green sheets and acrylic resin-type green sheets suffered sheet attack when terpineol or terpineol acetate were used as the solvents.

EXAMPLE 11

A conductive paste was manufactured by mixing 100 parts by weight of a nickel powder having a specific surface area of 3.5 m²/g and an average particle size of 0.2 μm as the conductive powder; 3 parts by weight of ethyl cellulose and 2 parts by weight of butyral resin as the resin binder; and 70 parts by weight of ethylene glycol diacetate and 30 parts by weight of octanol (iso-octanol) as the solvent; and by kneading then the mixture using a 3-roller mill. Octanol was added for dissolving the butyral resin.

This paste was printed on two types of 4 μm-thick barium titanate-type ceramic green sheets using a butyral resin or an acrylic resin as the resin binder, and was dried, as in Example 1. The portions of the ceramic green sheet covered by the conductive paste dry film were visually inspected to evaluate the extent of sheet attack. The evaluation results are given in Table 3.

EXAMPLES 12 to 14

Conductive pastes were manufactured as in Example 11, but using the solvents given in Table 3. Propylene glycol diacetate means 1,2-propylene glycol diacetate, and butylene glycol diacetate means 1,3-butylene glycol diacetate. The results of sheet attack evaluation, performed as in Example 11, are summarized jointly in Table 3.

COMPARATIVE EXAMPLES 5 to 7

Conductive pastes were manufactured as in Example 11, but using the solvents given in Table 3. Sheet attack was evaluated in the same way. The results are summarized jointly in Table 3.

TABLE 3

| | Solvent in the conductive paste | | Resin in the ceramic green sheet | |
|---|---|---|---|---|
| | Type | Proportion (parts by weight) | Butyral resin | Acrylic resin |
| Example 11 | Ethylene glycol diacetate | 70 | ○ | ○ |
| | Octanol | 30 | | |
| Example 12 | Propylene glycol diacetate | 70 | ○ | ○ |
| | Octanol | 30 | | |
| Example 13 | Butylene glycol diacetate | 70 | ○ | ○ |
| | Octanol | 30 | | |
| Example 14 | Butylene glycol diacetate | 50 | ○ | Δ |
| | Octanol | 50 | | |
| Comparative Example 5 | Terpineol | 100 | x | x |
| Comparative Example 6 | Terpineol acetate | 70 | x | Δ |
| | Octanol | 30 | | |
| Comparative Example 7 | Octanol | 100 | x | x |

As Table 3 shows, sheet attack occurred in the Comparative Examples where terpineol, terpineol acetate or octanol alone were used as the solvent; on the other hand, using ethylene glycol diacetate, propylene glycol diacetate, butylene glycol diacetate prevented swelling and deformation in a 4 μm-thick ceramic green sheet, even when octanol is also mixed in. Herein, swelling of an acrylic resin-type green sheet was observed for a 50/50 ratio mixture of butylene glycol diacetate and octanol.

As described above, internal electrode paste dry films of a predetermined shape are formed on ceramic green sheets using the conductive paste of the present invention, then a predetermined number of ceramic green sheets are pressure-laminated to form an unfired laminate in which the green sheets are alternately laminated with internal electrode paste layers, after which the unfired laminate is fired using conventional methods to yield a multilayer electronic component. Since the conductive paste of the present invention does not result in swelling or deformation of the ceramic green sheets, the resulting multilayer electronic component is thus free of ceramic layer deformation, delamination, cracking or the like brought about by sheet attack.

What is claimed is:

1. A conductive paste which is directly printed and co-fired on a ceramic green sheet used to form an electronic component, the conductive paste comprising a conductive powder, a resin containing a cellulose resin as a main component thereof and an organic solvent comprising at least one solvent selected from the group consisting of an alkylene glycol diacetate and an alkylene glycol dipropionate, wherein said alkylene glycol diacetate is a diacetate of an alkylene glycol having 2 to 6 carbon atoms and said alkylene glycol dipropionate is a dipropionate of an alkylene glycol having 2 to 6 carbon atoms.

2. The conductive paste according to claim 1, wherein said ceramic green sheet is a ceramic green sheet having a thickness of 5 μm or less.

3. The conductive paste according to claim 1, wherein said ceramic green sheet comprises a resin binder containing a butyral resin as a main component.

4. A multilayer electronic component obtained by firing at high temperature an unfired laminate prepared by alternately stacking ceramic green sheets and internal electrode paste layers, wherein each of said internal electrode paste layers is formed using the conductive paste according to claim 1.

5. The multilayer electronic component according to claim 4, wherein the thickness of said ceramic green sheets is 5 μm or less.

6. The multilayer electronic component according to claim 4, wherein each of said ceramic green sheets comprises a resin binder containing a butyral resin as a main component.

* * * * *